(12) United States Patent
Splitthoff et al.

(10) Patent No.: US 11,249,162 B1
(45) Date of Patent: Feb. 15, 2022

(54) MOTION CORRECTED BLIPPED CAIPIRINHA AND SMS

(71) Applicants: Siemens Healthcare GmbH, Erlangen (DE); The General Hospital Corporation, Boston, MA (US)

(72) Inventors: Daniel Nicolas Splitthoff, Erlangen (DE); Daniel Polak, Erlangen (DE); Kawin Setsompop, Charlestown, MA (US); Borjan Gagoski, Boston, MA (US)

(73) Assignees: Siemens Healthcare GmbH, Erlangen (DE); The General Hospital Corporation, Boston, MA (US)

( * ) Notice: Subject to any disclaimer, the term of this patent is extended or adjusted under 35 U.S.C. 154(b) by 0 days.

(21) Appl. No.: 16/984,391

(22) Filed: Aug. 4, 2020

(51) Int. Cl.
*G01R 33/565* (2006.01)
*G01R 33/56* (2006.01)
*G01R 33/561* (2006.01)
*G01R 33/483* (2006.01)

(52) U.S. Cl.
CPC ... *G01R 33/56509* (2013.01); *G01R 33/4835* (2013.01); *G01R 33/5608* (2013.01); *G01R 33/5611* (2013.01)

(58) Field of Classification Search
CPC ............ G01R 33/4835; G01R 33/5608; G01R 33/5611; G01R 33/56509
See application file for complete search history.

(56) References Cited

U.S. PATENT DOCUMENTS

| 10,275,875 | B2 | 4/2019 | Bhat et al. | |
|---|---|---|---|---|
| 2013/0099784 | A1* | 4/2013 | Setsompop | G01R 33/4826 324/309 |
| 2013/0181712 | A1* | 7/2013 | Sutton | G01R 33/56341 324/314 |
| 2017/0038448 | A1* | 2/2017 | Beck | G01R 33/4835 |

OTHER PUBLICATIONS

Setsompop, K., Gagoski, B.A., Polimeni, J.R., Witzel, T., Wedeen, V.J. and Wald, L.L. (2012), Blipped?controlled aliasing in parallel imaging for simultaneous multislice echo planar imaging with reduced g-factor penalty. Magn. Reson. Med., 67:1210-1224. doi:10.1002/mrm.23097.

* cited by examiner

*Primary Examiner* — Gregory H Curran
(74) *Attorney, Agent, or Firm* — Schiff Hardin LLP

(57) ABSTRACT

Techniques are disclosed related to the compensation of phase offsets introduced into k-space lines as a result of encoding of blip gradients due when motion is present, which may be used for parallel magnetic resonance imaging (MRI) techniques such as blipped SMS or blipped CAIPIRINHA. The compensation of these additional phase offsets may prevent artifacts that would otherwise be present in the reconstructed images as a result of motion during the MRI scanning procedure. The additional phase offsets may be accounted for during the image acquisition phase of the MRI scan or, alternatively, during the image reconstruction phase.

20 Claims, 4 Drawing Sheets

MOTION CORRECTED BLIPPED CAIPIRINHA AND SMS

TECHNICAL FIELD

The present disclosure concerns motion correction techniques and, in particular, techniques that compensate for motion-induced phase offsets in accordance with the use of blipped Simultaneous Multi-Slice (SMS) and blipped Controlled Aliasing in Parallel Imaging Results in Higher Acceleration (CAIPIRINHA) imaging techniques used in magnetic resonance imaging (MRI) scans.

BACKGROUND

Several types of motion correction techniques for MRI scans are conventionally used to eliminate or reduce artifacts caused by the motion of an imaged object. Some examples of such conventional techniques include using image data (2D slice stacks or 3D volumes), or using additional detection techniques such as skin surface detection or tracking applied landmarks (e.g. markers).

However, these conventional approaches cannot be combined with blipped parallel imaging techniques such as blipped SMS or blipped CAIPIRINHA, as such methods make use of an additional gradient (referred to as a blip or blipped gradient) to apply supplemental encoding in three-dimensional k-space. Furthermore, conventional motion correction techniques ignore the additional gradient implemented by the aforementioned parallel imaging techniques, leading to inconsistent gradient moment accumulation depending on the motion state of the imaged object during image acquisition, which results in corrupted image reconstruction. As a result, conventional MRI motion correction techniques have several drawbacks.

SUMMARY

As noted above, conventional motion correction techniques for MRI scans cannot be combined with parallel imaging techniques such as blipped SMS or blipped CAIPIRINHA without introducing artifacts into the reconstructed images. As further discussed below, blipped SMS and blipped CAIPIRINHA utilize an additional blipping gradient to provide a phase offset within a 3D slab or between jointly acquired MR data slices, which are recorded as raw data in k-space along a specific k-space trajectory. In other words, the blipped gradients provide a predetermined phase dispersion within a volume of interest, which leads to field of view (FOV) shifts of the aliased slices/voxel groups. Assuming motion can be ignored during the short time a gradient is applied, the effect of motion is that the volume is shifted to a different position relative to the origin of the gradient system (isocenter). Therefore, the desired phase dispersion within the volume is still achieved.

However, in addition to this "inter-slice" phase dispersion or phase ramp, which results from the use of the blipping gradient, the separate k-space entities/lines are also phase shifted depending on the motion state of the scanned object while the MR signals are acquired. In other words, each of the acquired MR data slabs or slices have an inter-slice phase offset (i.e., the aforementioned phase ramp or dispersion) with respect to one another that is a result of encoding of the blipped gradient. In addition to this, the movement of the object during the MR signal acquisition phase introduces a "motion-induced" phase offset to sequentially acquired k-space lines of the acquired MR data. For 3D acquisition techniques, encoding an additional phase offset is introduced in the same way by movement in the case of CAIPIRINHA blips. In the following, the concepts will be discussed for the 2D case using SMS blips; these apply analogously for the 3D case using CAIPIRINHA blips.

The aspects described herein compensate for the aforementioned motion-induced phase offset in various ways, as further discussed in detail below. For instance, the motion-induced phase offset may be accounted for during the MR signal acquisition phase by adapting the MR data acquisition parameters such as sampling rate and/or phase settings. Optionally, this may be implemented automatically as part of the MRI system's motion correction (MOCO) framework. As another example, the motion-induced phase offset may be accounted for during the image reconstruction phase. In any event, information regarding the motion states may be acquired via suitable prospective tracking mechanisms, such as camera systems, for instance, or additional imaging data, such as navigators, for instance. Advantageously, compensation of the motion-induced phase offset during the image reconstruction phase may also allow for other, supplementary phase offsets to accounted for during the image reconstruction phase in case of more sophisticated phase profiles (e.g. as caused by the Wave technique).

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The exemplary embodiments of the present disclosure will be described with reference to the accompanying drawings. The drawing in which an element first appears is typically indicated by the leftmost digit(s) in the corresponding reference number.

DETAILED DESCRIPTION

Figure 1:
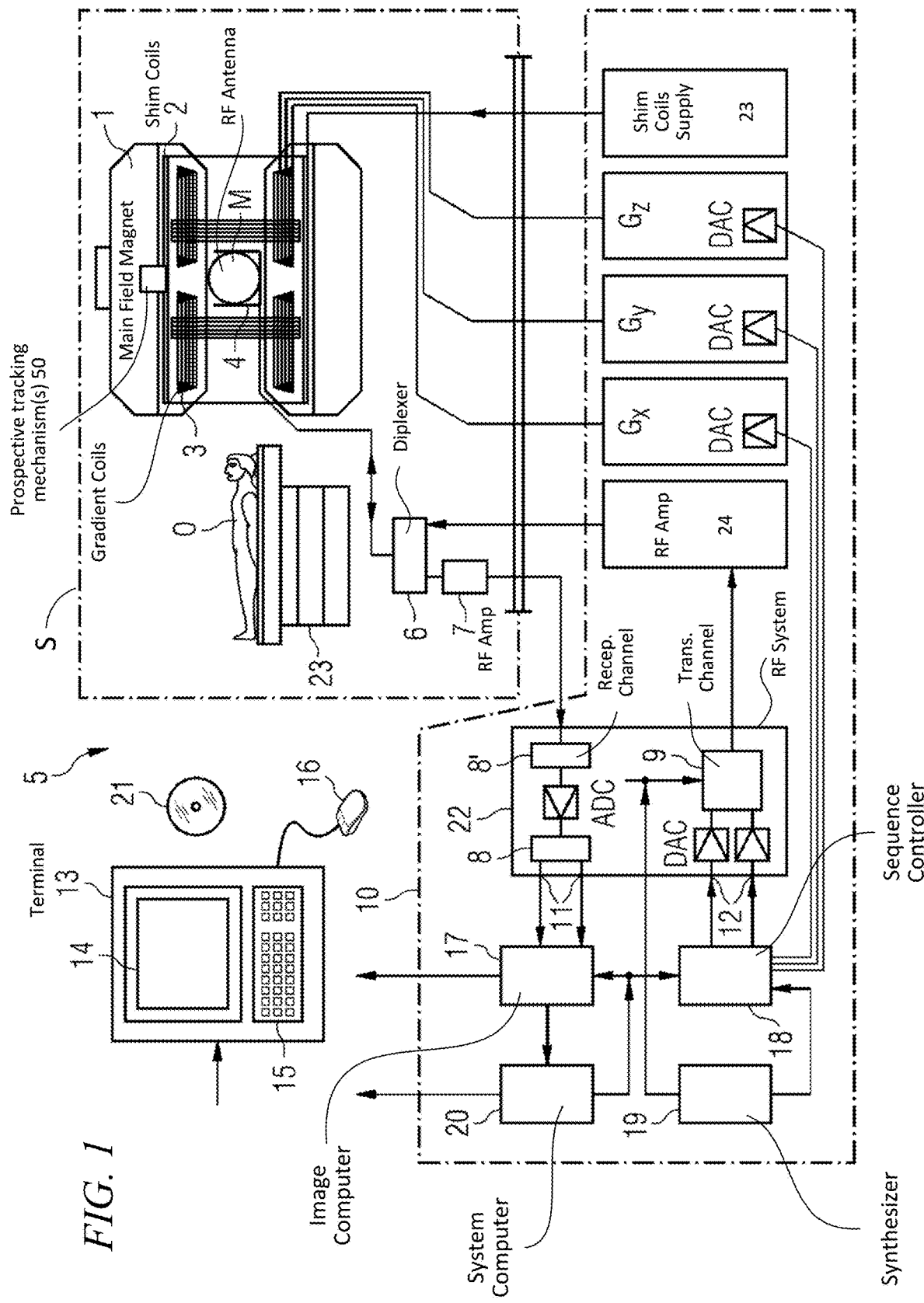
FIG. 1 illustrates a representation of a magnetic resonance device, in accordance with an exemplary embodiment of the present disclosure.

FIG. 1 illustrates a representation of a magnetic resonance device, in accordance with an exemplary embodiment of the present disclosure. As shown in FIG. 1, a magnetic resonance apparatus 5 (e.g., a magnetic resonance imaging or tomography device) is shown. A main field magnet system 1 generates a temporally-constant strong magnetic field (main magnetic field) for the polarization or alignment of the nuclear spin in a region of an examination subject or object O, such as a portion of a human body that is to be examined, and who is lying on a table 23 to be moved into the magnetic resonance apparatus 5. The high degree of homogeneity in the magnetic field generated via the main field magnet system 1 necessary for the magnetic resonance measurement (data acquisition) is defined in a typically sphere-shaped measurement volume M, in which the portion of the human body that is to be examined is placed. To support the homogeneity requirements, temporally-constant effects are eliminated by shim-plates made of ferromagnetic materials that are placed at appropriate positions. Temporally-variable effects are eliminated by shim-coils 2 and an appropriate control unit 23 for the shim-coils 2.

A cylindrically-shaped gradient coil system 3 (or alternatively, gradient field system) is incorporated in the main field magnet system 1, composed of three windings. The gradient coil system 3 is also used to apply a magnetic field gradient, which determines the magnetic resonance frequency (Larmor frequency) at the respective location. Each winding is supplied by a corresponding amplifier Gx, Gy, and Gz, with power for generating a linear gradient field in a respective axis of a Cartesian coordinate system. The first partial winding of the gradient field system 3 generates a gradient Gx in the x-axis, the second partial winding generates a gradient Gy in the y-axis, and the third partial winding generates a gradient Gz in the z-axis. Each corresponding amplifier Gx, Gy, and Gz has a digital-analog converter (DAC), controlled by a sequence controller 18 for the accurately-timed generation of gradient pulses. The gradient field system 3 may additionally utilize one or more of the first, second, or third partial windings of the gradient field system 3 to generate a blipped gradient in one or more of the x-axis, the y-axis, and/or the z-axis using a respective Gx, Gy, and/or Gz amplifier, which applies supplemental encoding in three-dimensional k-space, as discussed herein and as generally known in accordance with blipped parallel imaging techniques such as blipped SMS and blipped CAIPIRINHA.

A radio-frequency (RF) antenna 4 is located within the gradient field system 3 and is used to convert the RF pulses provided by a radio-frequency power amplifier 24 into a magnetic alternating field for the excitation of the nuclei by tipping ("flipping") the spins in the subject or the region thereof to be examined from the alignment produced by the magnetic field generated via the main field magnet system 1. To do so, the radio-frequency antenna 4 is comprised of one or more RF transmitting coils and one or more RF receiving coils in the form of an annular, linear, or matrix type configuration of coils. As the excited nuclear spins relax, RF signals, referred to as magnetic resonance (MR) signals, are emitted in a resonant manner, being received by the RF antenna 4 and then further processed as discussed below.

Thus, the alternating field based on the precessing nuclear spin, i.e., the nuclear spin echo signal normally produced from a RF pulse sequence composed of one or more RF pulses and one or more gradient pulses, is also converted by the RF receiving coils of the radio-frequency antenna 4 into a voltage (measurement signal), which is transmitted to a radio-frequency system 22 via an RF amplifier 7 of a radio-frequency receiver channel 8, 8'. Acquisition of the MR signals takes place in the spatial frequency space or "k-space," with the k-space being temporally traversed along a "gradient trajectory" that is defined by the switching of the gradient pulses during measurement, of a slice for example, while the RF pulses are transmitted in a time-coordinated manner. In other words, the MR signals are recorded as "raw data" in k-space along a particular k-space trajectory that is dependent upon the timing of the particular transmitted gradient pulse sequence. As further discussed below, the desired image data can then be reconstructed from the recorded raw data in k-space thus acquired by means of a two-dimensional Fourier transform.

The radio-frequency system 22 further includes a transmitting channel 9, in which the RF pulses for the excitation of the magnetic nuclear resonance are generated. For this purpose, the respective RF pulses are digitally depicted in the sequence controller 18 as a series of complex numbers, based on a given pulse sequence provided by the system computer 20. This number series is sent via an input 12, in each case, as real and imaginary number components to a digital-to-analog converter (DAC) in the radio-frequency system 22 and from there to the transmitting channel 9. The pulse sequences are modulated in the transmitting channel 9 to a RF carrier signal, the base frequency of which corresponds to the resonance frequency of the nuclear spin in the measurement volume. The modulated pulse sequences of the RF transmitter coil are transmitted to the RF antenna 4 via an amplifier 24. Although a single transmission channel and receiving channel are shown and described with reference to FIG. 1, this is for purposes of brevity and provided by way of example and not limitation. As explained in further detail herein, the embodiments herein include acquisition of MR signals using any suitable type of parallel imaging technique such as blipped SMS and blipped CAIPIRINHA, for instance. Thus, the magnetic resonance apparatus 5 may include any suitable number of receiving and/or transmission channels configured for this purpose, and the radio-frequency system 22 may be further modified to facilitate the control, transmission, and reception of data in accordance with these additional channels.

Switching from a transmitting to a receiving operation occurs via a transmission-receiving switch 6. The RF transmitting coil of the radio-frequency antenna 4 radiates the radio-frequency pulse for the excitation of the nuclear spin in the measurement volume M and scans the resulting echo signals via the RF receiving coils. The corresponding magnetic resonance signals obtained thereby are demodulated to an intermediate frequency in a phase sensitive manner in a first demodulator 8' of the receiving channel of the radio-frequency system 22, and digitized in an analog-digital converter (ADC). This signal is then demodulated to the base frequency. The demodulation to the base frequency and the separation into real and imaginary parts occurs after digitization in the spatial domain in a second demodulator 8, which emits the demodulated data via outputs 11 to an image processor 17.

Therefore, generally predefined pulse sequences determined during measurement, in other words sequences of defined RF pulses as well as gradient pulses and blipped gradient pulses in different directions and read-out windows, are used to activate a magnetic resonance tomography system while the receive antennas are switched to receive, and the MR signals are acquired via the process of receiving, processing, and recording these signals as raw data in k-space. To do so, the predefined pulse sequences are generally established beforehand in accordance with any suitable type of measurement protocol together with other control data for the measurement.

In an image processor or image computer 17, an MR image is reconstructed from the measurement data (e.g. the raw data recorded in k-space) obtained in this manner, which includes computation of at least one disturbance matrix and the inversion thereof, in the image processor 17. The management of the measurement data, the image data, and the control program occurs via the system computer 20. The sequence controller 18 controls the generation of the desired pulse sequences and the corresponding scanning of k-space with control programs. The sequence controller 18 controls accurately-timed switching (activation) of the gradients, the transmission of the radio-frequency pulse with a defined phase amplitude, and the reception of the magnetic resonance signals. The time base for the radio-frequency system 22 and the sequence controller 18 is provided by a synthesizer 19. The selection of appropriate control programs for the generation of an MR image, which are stored, for example, on a DVD 21 or other suitable storage media, as well as other user inputs such as any suitable number N of adjacent clusters, collectively cover the desired k-space. The display of the generated MR images may thus be facilitated via a terminal 13, which includes units for enabling input entries, such as, e.g. a keyboard 15, and/or a mouse 16, and a unit for enabling a display, such as, e.g. a display screen.

The components within the dot-dash outline S are commonly called a magnetic resonance scanner, a magnetic resonance data acquisition scanner, or simply a scanner. The components within the dot-dash outline 10 are commonly called a control unit, a control device, or a control computer.

Thus, the magnetic resonance apparatus 5 as shown in FIG. 1 may include various components to facilitate the measurement, collection, and recording of MR signals as raw data, as well as reconstructing image data from the measured MR signals that are recorded as raw data into an arrangement of k-space. The embodiments described herein are directed to the identification and compensation of motion-induced phase offset that is introduced as a result of motion of an object during acquisition of the MR signals by the control device 10 as discussed above. This motion-induced phase offset is in addition to the phase-offset or phase ramp that is introduced as a result of encoding of the blipping gradient, which is used to apply supplemental encoding in three-dimensional k-space in accordance with parallel imaging techniques such as blipped SMS or blipped CAIPIRINHA MRI imaging scans, for instance. Thus, the phase offset compensation embodiments discussed herein may advantageously be applied in accordance with other conventional motion correction techniques to further compensate for phase offsets introduced via patient or object motion during MR signal acquisition. Although the embodiments disclosed herein are described in the context of blipped SMS or blipped CAIPIRINHA MRI imaging scan techniques, this is by way of example and not limitation. The embodiments described herein may perform motion-induced phase offset compensation in accordance with any suitable MRI scanning techniques to reduce or eliminate artifacts that would otherwise occur in the resulting reconstructed clinical MR images.

For example, the magnetic resonance apparatus 5 is configured to perform blipped SMS or blipped CAIPIRINHA MRI imaging scans, which simultaneously acquires MR signals in several "slices" or "slabs" of an object positioned within the measurement volume M. Continuing this example, the MR signals of the object are acquired by the radio frequency system 22 receiving the MR signals via the receiving channel Again, these MR signals are the result of the precessing nuclear spins of the object in response to a transmitted imaging pulse sequence. In the case of blipped parallel imaging techniques (e.g. blipped SMS or blipped CAIPIRINHA MRI), the transmitted imaging pulse sequence includes one or more RF pulses, one or more gradient sequence pulses applied in the x, y, and z directions via the Gx, Gy, and Gx amplifiers, and one or more blipped gradients. The acquired MR signals may be acquired in a per-slice manner, with multiple slices being acquired simultaneously in accordance with parallel imaging techniques such as blipped SMS. Alternatively, the MR signals may be acquired as 3D slabs using CAIPIRINHA blips, and the embodiments described herein may apply equally to MR data acquired using this technique. Moreover, various three-dimensional imaging techniques may be performed such as 3D SMS, for instance, and the embodiments described herein may apply equally to MR data acquired using such 3D image acquisition techniques.

Figure 2:
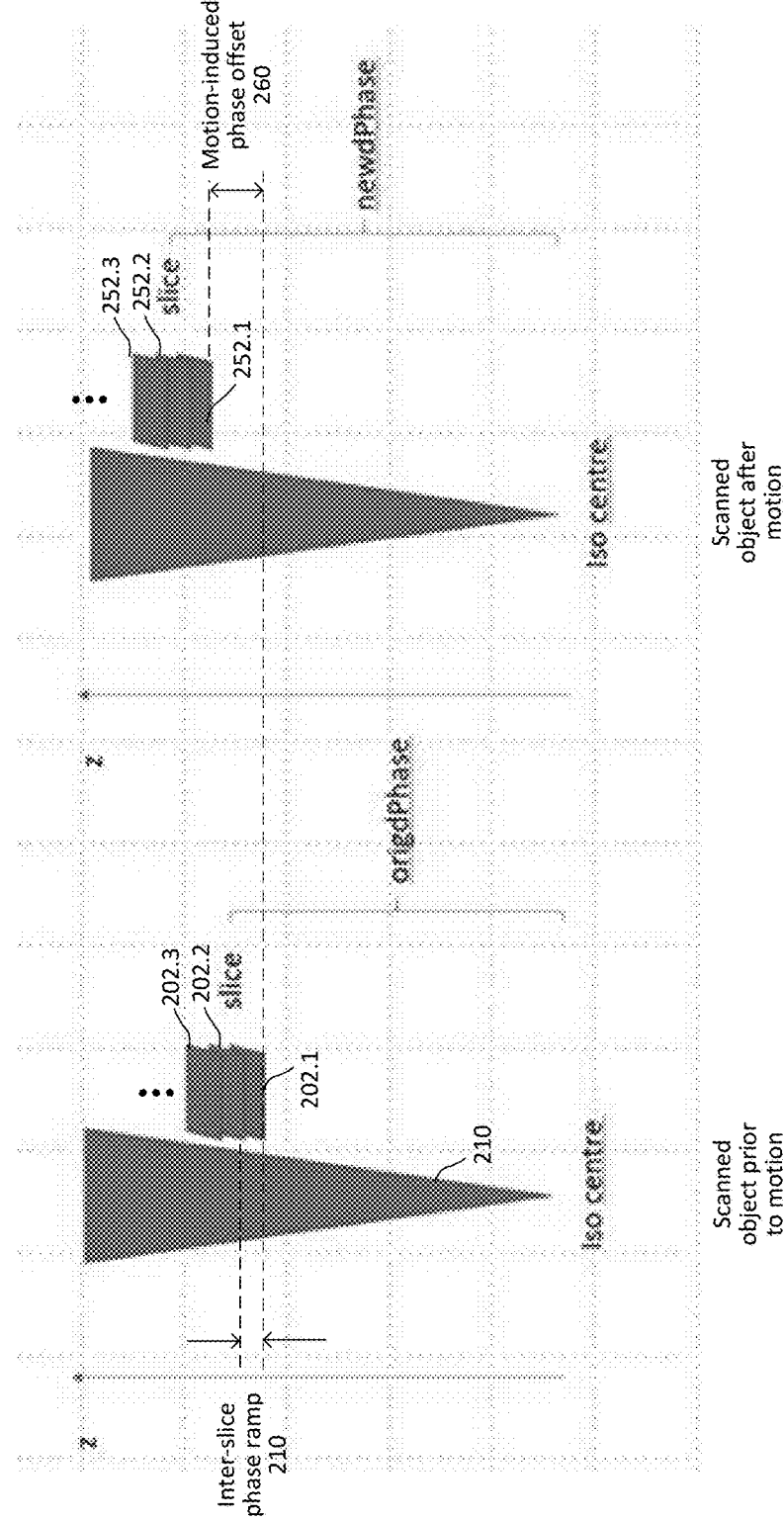
FIG. 2 illustrates the effect of a motion-induced phase offset on a set of acquired magnetic resonance (MR) slices, in accordance with an exemplary embodiment of the present disclosure.

In any event, as a result the MR signals may be recorded and stored in a suitable memory that is, for instance, integrated as part of the MR apparatus 5 or otherwise accessible by the MR apparatus 5. The MR signals for each slice may thus be recorded such that each slice from among the multiple slices is associated with a respective set of recorded lines of raw data in k-space. Turning now to FIG. 2 as an example, three slices 201.1-201.3 are shown for purposes of brevity, although it will be understood that the MR signal acquisition process may result in the recordation of any suitable number N of slices 201.1-201.N. In the case of a blipped parallel imaging technique, the blipped gradient provides supplemental encoding as the MR signals are recorded as raw data in k-space within each respective slice. In particular, the blipped gradients cause the k-space lines within each slice 201.1-201.3 to have specific phase ramps that function to separate each of the slices 201.1-201.3 from one another by a an amount of phase in the slice direction, which is the 'z' axis direction in the example shown in FIG. 2. In other words, the blipped gradients, when encoded into the recorded raw data, facilitate a phase dispersion within a volume of interest. The funnel 210 as shown in FIG. 2 thus represents the phase effect of the blipped gradient viewed from the perspective of the isocenter.

With continued reference to FIG. 2, the blipped gradient allows the slices 202.1-202.3 to be distinguished when subsequently processed as part of the image reconstruction phase via the image processor 17. That is, if the slices 202.1-202.N did not have an inter-slice phase ramp 210 as a result of the supplemental encoding provided via the blipped gradient, the Fourier transform of the raw data in k-space associated with each of the slices 202.1-202.3 (having an equal phase) could not be readily distinguished from one another. As shown in FIG. 2, the inter-slice phase ramp 210 exists prior to and after movement of an object as the MR signals are being acquired via the MR apparatus 5. However, when the object moves during MR signal acquisition, this causes the introduction of an additional motion-induced phase offset 260 to the set of slices 201.1-202.3, which are represented in the right portion of FIG. 2 as slices 252.1-252.3.

As a result of the motion-induced phase offset 260, this phase variation over time leads to a phase variation in k-space. As a result, each sequentially acquired k-space line associated, in this example, with the different slices 252.1-252.3, now has a different phase offset, which increases along the z direction as shown. In case of SMS, each k-space line contains data from several slices. This difference in phase offset leads to artifacts when the raw data is reconstructed to provide clinical images of the object. In other words, the k-space lines of each slice 252.1-252.3 have a phase ramp (i.e. the inter-slice phase ramp 210) with respect to the other slices, which is introduced via an encoding of the one or more gradient blip pulses, as well as a phase offset (i.e. the motion-induced phase offset 260) as a result of motion of the object during MR signal acquisition.

The embodiments herein advantageously recognize that this motion-induced phase offset 260 functions as a "global"

and constant phase offset to the entirety of the slices 202.1-202.N, and thus may be compensated for by identifying the motion of the object. Specifically, the motion-induced phase offset 260 may be subtracted from the slices 252.1-252.3 (i.e., from the k-space lines of each one of the slices 252.1-252.3) to generate phase-corrected slices similar or identical to the initial slices 202.1-202.3. In doing so, these phase-corrected slices may be used for image reconstructions to significantly reduce or eliminate artifacts that would otherwise be present.

As further discussed herein, the motion-induced phase offset 260 may be subtracted from the acquired slices during the MR signal acquisition phase or during the image reconstruction phase. In any event, motion data indicative of the motion of the object while the MR signals are being acquired may be obtained for this purpose. To do so, the MR apparatus 5 may additionally include one or more prospective tracking mechanisms 50, as shown in FIG. 1. Such prospective tracking mechanisms 50 may include, for instance, 2D or 3D cameras that may function in accordance with any suitable wavelength to provide tracking data (e.g. 2D slice stacks or 3D volumes) indicating the motion of an object positioned within the measurement volume M over a suitable time sampling period. An example of such a camera system includes the KinetiCor camera system developed by KinetiCor, Inc. headquartered in Honolulu, Hi. These prospective tracking mechanisms 50 may transmit motion data to one or more components of the control unit 10 in any suitable manner to facilitate the received motion data for compensation of the motion-induced phase offset 260 as described herein. As additional examples, the prospective tracking mechanisms 50 may function using skin surface detection, tracking of applied landmarks, such as markers, for instance, etc.

Additionally or alternatively, other detection techniques may be implemented that may or may not require additional hardware components such as cameras. For example, MR-signal based navigators may be used. The aforementioned tracking mechanisms are provided by way of example and not limitation, and the embodiments described herein may utilize motion data from any suitable source. Moreover, the embodiments described herein may utilize the motion data to determine when the motion-induced phase offset 260 needs to be compensated, and otherwise not doing so when no motion is detected (e.g. when motion of an object is less than a threshold positional change during a threshold time period).

Regardless of the manner in which the motion data is received via the control unit 10, embodiments include using the motion data to compensate for the motion-induced phase offset 260. Again, this may be done during the acquisition of the MR signals or during the reconstruction of the image from the recorded raw data. The compensation of the motion-induced phase offset 260 during the MR signal acquisition is first discussed below in further detail, followed by the compensation of the motion-induced phase offset 260 during image reconstruction.

In various embodiments, the motion data may be received by one or more components of the control unit 10 and used to compensate for the manner in which the MR signals are acquired and then recorded as raw data in a k-space trajectory for each acquired slice. To do so, it is noted that the motion data indicates a motion state of the object during acquisition of the MR signals, and thus advantageously identifies a movement trajectory of the k-space lines of recorded raw data of each acquired slice. As an example, one or more MR signal acquisition parameters may be modified using the motion data to adjust phase-relationships of the raw data k-space trajectories associated with the acquired slices. These modifications may be calculated, for instance, via the system computer 20 and then transmitted to the radio frequency system 22, which may execute various modifications to how the MR signals are recorded as raw data in k-space. Such modifications may include, for instance, modifying a sampling phase (e.g. phase manipulations to the recorded raw data in k-space) used for acquiring the MR signals to compensate for the motion-induced phase offset 260. In this way, the modified MR signal acquisition parameters facilitate the recording of "motion-corrected" lines of raw data in k-space. The motion-corrected lines of raw data may be recorded as part of any suitable type of motion correction procedure, including known techniques. For instance, a MOCO framework may be used for this purpose, as described in further detail in the European patent application no. EP3078980A1, which is incorporated by reference in its entirety.

To do so, it may be assumed that a motion state of the object as indicated by the motion data does not change for a brief time period during which the system computer 20 and radio frequency system 22 are able to effectuate these modifications in accordance with the next block of instructions (e.g. on the order of 5-100 ms). For instance, the inter-slice phase ramps 210 between the slices 202.1-202.3 due to the blipped gradients may be known a priori from the imaging sequence that is currently being used to acquire the MR signals. Moreover, there exists a linear relationship between detected motion and the phase offset to each slice as a result of that motion. In other words, a modification of the MR signal acquisition parameters to compensate for the motion-induced phase offset 260 may include modifying the phase used for acquiring the MR signals.

Embodiments include utilizing this information to account for the motion-induced phase offset in the RF system 22 when setting up the instructions for the next block for MR signal acquisition. Thus, a phase-offset correction may be calculated specific phase ramps as a result of encoding of the blipped gradient) and exploiting the linear relationship between the detected motion and the phase offset to each slice caused by the detected motion. As an example, the phase-offset correction may represent a scalar phase value that may be subtracted as the acquired MR signals are being acquired by introducing an appropriate phase offset in the ADC configuration controlled via the RF system 22.

As another example, the corrections for the motion-induces phase offset may be performed using complex values in addition to or instead of the use of scalar values. For instance, the complex-acquired data may be multiplied by a complex number with a negative phase. These modifications may be performed, for instance, by modifying the numerically controlled oscillator (NCO) settings used by the RF system 22, which may include corrections in accordance with the MOCO framework or separate corrections.

Thus, when the motion-induced phase offset 260 is accounted for during the MR signal acquisition phase, the MR signal acquisition parameters may be modified such that the MR signals are recorded as lines of raw data in k-space having a phase offset with respect to other lines in k-space that compensates for the additional motion-induced phase offset 260.

When the motion-induced phase offset 260 is compensated during the MR signal acquisition phase, the reconstruction phase may include using the recorded raw data in k-space to reconstruct the clinical images of the object without additional compensation being performed. In other words, the image reconstruction may proceed in a usual manner, as the recorded lines of raw data in k-space are already organized in a manner that accounts for the additional motion-induced phase offset 260.

Alternatively, the motion-induced phase offset 260 may be subtracted from each of the acquired slices lines of raw data in k-space during the image reconstructions phase via the image processor 17. In accordance with such embodiments, the MR signals are recorded as raw data in k-space for each of the slices in the usual manner, i.e. without calculating and subtracting the motion-induced phase offset 260. However, the motion data may still be received during the MR signal acquisition phase and stored in a suitable memory with a timestamp or other suitable means by which the motion data can be time-correlated to the recorded lines of raw data in k-space for each acquired slice. The motion data may be stored in the same memory as the recorded raw data or a separate memory that may be integrated as part of the MR apparatus 5 (e.g. integrated as part of the image computer or processor 17) or otherwise accessible by the MR apparatus 5.

Using this motion data, the phase-offset correction may then be calculated and subtracted from the recorded raw data in k-space at any subsequent phase of the imaging procedure. The calculation and subtraction may (but need not) occur in the same step in the MR imaging sequence. For instance, a corresponding phase-offset correction may be calculated during the MR signal acquisition phase from the motion data, which indicates the motion-induced phase offset 260. The phase-offset correction may then be applied to subtract out the motion-induced phase offset 260 during the image reconstruction phase, or the phase-offset correction may be calculated and used to subtract out the motion-induced phase offset 260 in the image reconstruction phase. As an example, the phase-offset correction may be implemented by modifying a sampling frequency associated with the recorded lines of raw data in k-space during the reconstruction phase such that the k-space trajectory of each slice or slab of MR data, as the case may be, is sampled in a manner that results in a cancellation of the additional motion-induced phase offset 260.

In any event, the motion data, the calculation of the motion-induced phase offset 260, and/or the calculation of the phase-offset correction may be received (e.g. by the image processor 17) prior to the generation of the one or more reconstructed clinical images of the object. In other words, the motion-induced phase offset 260 may be subtracted during the generation of the one or more reconstructed clinical images of the object after the lines of raw data have already been recorded in k-space (without phase offset adjustments being made during recording). Upon subtracting or otherwise compensating for the motion-induced phase offset 260 in the recorded raw data for each acquired slice, the image reconstruction may proceed in any suitable manner, including the use of image reconstruction techniques that are generally known, and thus additional detail is not provided with respect to the image reconstruction phase as described herein.

The specific times during the MR imaging procedure in which the motion-induced phase offset 260 may be calculated and subtracted from the recorded raw data are provided by way of example and not limitation. In various embodiments, the motion-induced phase offset 260 may be calculated and subtracted during any suitable portion of the MR imaging procedure performed by the MR apparatus 5.

The magnetic resonance apparatus 5 may include additional, fewer, or alternate components that are not depicted in FIG. 1 for purposes of brevity. For instance, the magnetic resonance apparatus 5 may alternatively include, or include in addition to the DVD 21, one or more non-transitory computer-readable data storage media in accordance with various embodiments of the present disclosure. Thus, the aforementioned non-transitory computer-readable media may be loaded, stored, accessed, retrieved, etc., via one or more components accessible to, integrated with, and/or in communication with the magnetic resonance apparatus 5 (e.g., network storage, external memory, etc.). For example, such data-storage mediums and associated program code may be integrated and/or accessed via the terminal 13, the control device 10 or components thereof such as the control computer 20, the image computer 17, the sequence controller 18, the RF system 22, etc.

Figure 3:
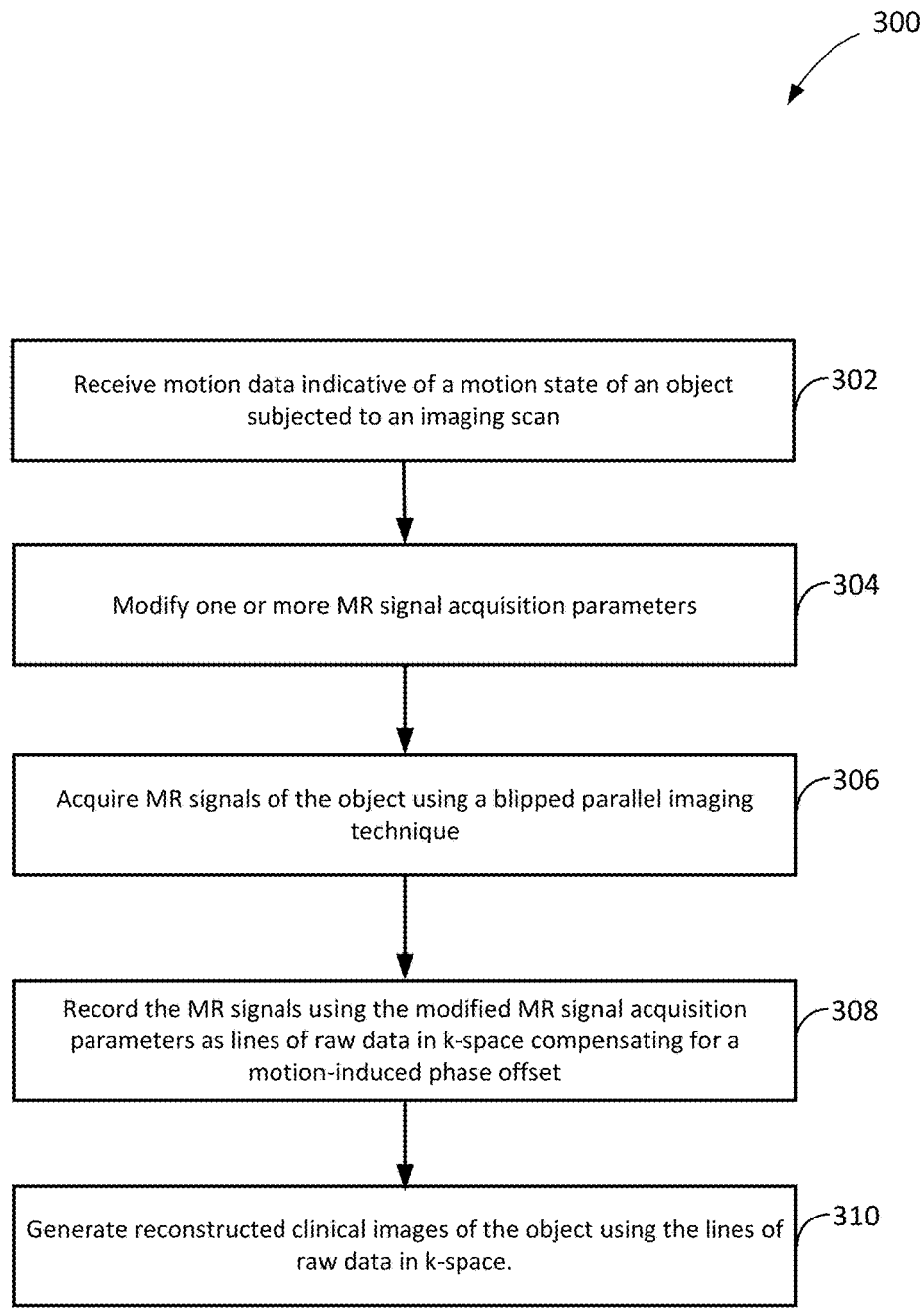
FIG. 3 is an example flow for correcting for motion-induced phase offset as a result of motion of an object during an MR scan during MR signal acquisition, in accordance with an exemplary embodiment of the present disclosure.
Figure 4:
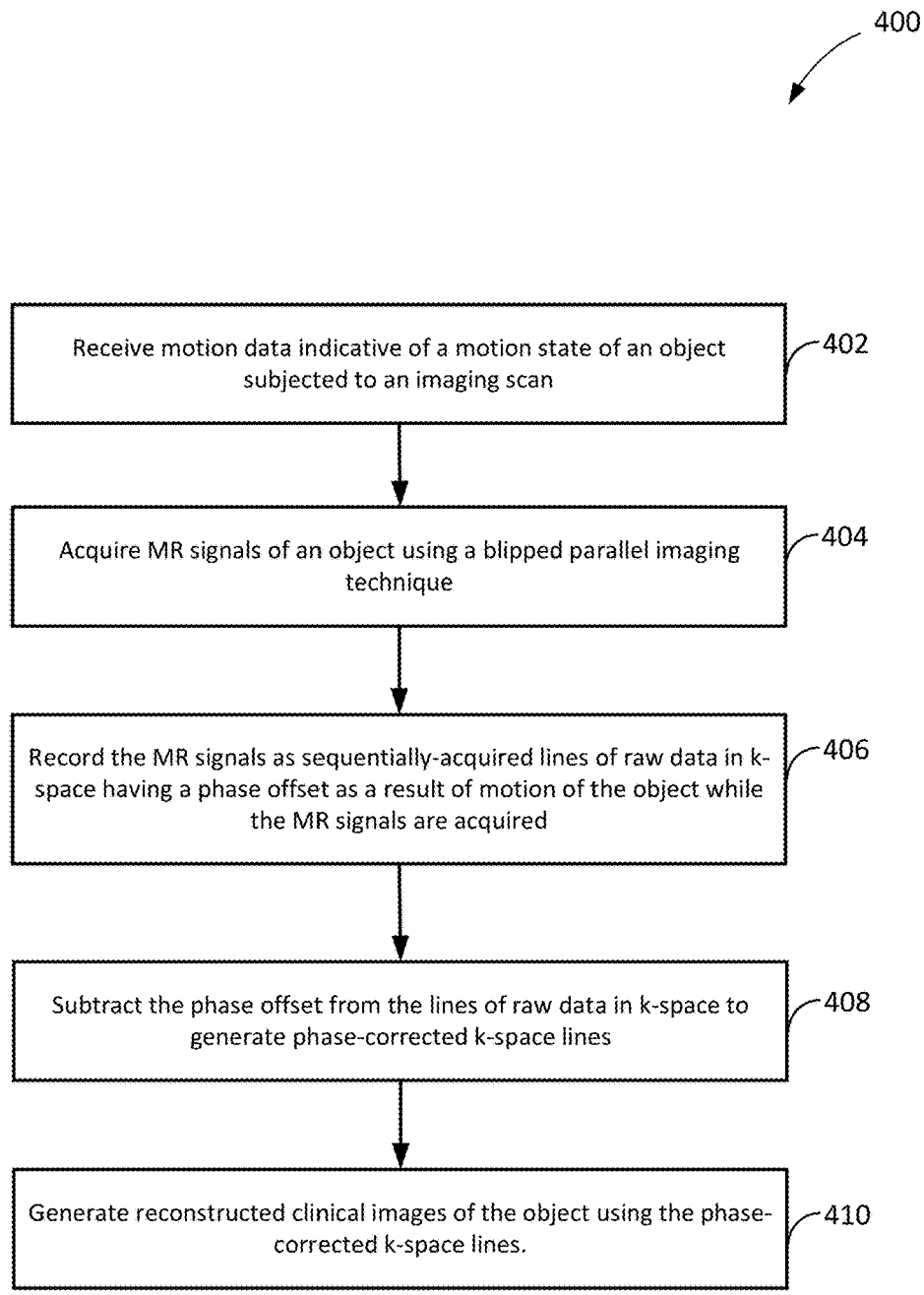
FIG. 4 is an example flow for correcting for motion-induced phase offset as a result of motion of an object during an MR scan after MR signal acquisition, in accordance with an exemplary embodiment of the present disclosure.

With reference to FIGS. 3 and 4, which illustrate respective flows 300, 400, these flows may be respective computer-implemented methods executed by and/or otherwise associated with one or more processors and/or storage devices (e.g. the aforementioned memories and/or non-transitory computer-readable media). These processors and/or storage devices may be, for instance, accessible to, integrated with, and/or in communication with the magnetic resonance apparatus 5 (e.g., network storage, external memory, etc.). For example, the one or more processors and/or storage devices may be integrated and/or accessed via the terminal 13, the control device 10 or components thereof such as the system computer 20, the image computer 17, the sequence controller 18, the RF system 22, etc. Moreover, in embodiments, flows 300, 400 may be performed via one or more processors and/or components of the MR apparatus 5 executing instructions stored on a suitable storage medium (e.g., a non-transitory computer-readable storage medium). Embodiments may include alternate or additional steps that are not shown in FIGS. 3 and 4 for purposes of brevity. Moreover, the blocks are provided in a specific sequential order as shown in the flows 300, 400 by way of example and for ease of explanation. Embodiments include the various steps described in each of the flows 300, 400 being performed in any order with respect to one another, or concurrently when it is suitable to do so.

FIG. 3 is an example flow for correcting for motion-induced phase offset as a result of motion of an object during an MR scan during MR signal acquisition, in accordance with an exemplary embodiment of the present disclosure.

Flow 300 may begin with one or more processors (e.g., the system computer 20 and/or the RF system 22) receiving (block 302) motion data indicative of a motion state of an object subjected to an imaging scan. This may include, for example, receiving motion data from a suitable prospective tracking mechanism or other suitable source of motion detection as discussed herein to identify a motion state of an object during MR signal acquisition.

Flow 300 may further include one or more processors (e.g., the system computer 20 and/or the RF system 22) modifying (block 304) one or more MR signal acquisition parameters. This may include, for example, using the received (block 302) motion data to adjust phase-relationships of the raw data k-space trajectories associated with the acquired slices and/or modifying a sampling phase used for acquiring the MR signals to compensate for the motion-induced phase offset, as discussed herein with respect to FIG. 2.

Flow 300 may further include one or more processors (e.g., the system computer 20 and/or the RF system 22)

acquiring (block 306) MR signals of the object using a blipped parallel imaging technique. This may include, for example, acquiring multiple slices of MR data in accordance with a blipped SMS or blipped CAIPIRINHA technique as discussed above.

Flow 300 may further include one or more processors (e.g., the system computer 20 and/or the RF system 22) recording (block 308) the MR signals in accordance with the modified (block 304) MR signal acquisition parameters. The recording may include, for instance, recording the MR signals as multiple lines of raw data organized in k-space. The modified MR signal acquisition parameters facilitate the lines of raw data being recorded in k-space with a phase offset with respect to one another that compensates for the additional motion-induced phase offset during the MR acquisition, as discussed herein with respect to FIG. 2.

Flow 300 may further include one or more processors (e.g., the system computer 20 and/or the image computer 17) generating (block 310) reconstructed clinical images of the object using the recorded (block 308) motion-corrected lines of raw data in k-space, as discussed herein with respect to FIG. 2.

FIG. 4 is an example flow for correcting for motion-induced phase offset as a result of motion of an object during an MR scan after MR signal acquisition, in accordance with an exemplary embodiment of the present disclosure.

Flow 400 may begin with one or more processors (e.g., the system computer 20 and/or the RF system 22) receiving (block 402) motion data indicative of a motion state of an object subjected to an imaging scan. Again, this may include, for example, receiving motion data from a suitable prospective tracking mechanism or other suitable source of motion detection as discussed herein to identify a motion state of an object during MR signal acquisition.

Flow 400 may further include one or more processors (e.g., the system computer 20 and/or the RF system 22) acquiring (block 404) MR signals of the object using a blipped parallel imaging technique. This may include, for example, acquiring multiple slices of MR data in accordance with a blipped SMS or blipped CAIPIRINHA technique as discussed above.

Flow 400 may further include one or more processors (e.g., the system computer 20 and/or the RF system 22) recording (block 406) the MR signals. The recording may include, for instance, recording the MR signals as sequentially-acquired lines of raw data organized in k-space. The lines of recorded raw data may be recorded in k-space having a phase ramp with respect to one another (e.g. the inter-slice phase ramp), as well as a phase offset (e.g. a motion-induced phase offset) caused by motion of the object during the acquisition (block 404) of the MR signals, as discussed herein with respect to FIG. 2.

Flow 400 may further include one or more processors (e.g., the system computer 20 and/or the RF system 22) subtracting (block 408) or otherwise compensating for the motion-induced phase offset by calculating and subtracting a phase-offset correction from the recorded lines of raw data in k-space to "rewind" the phase-offset with respect to each of the sequentially-acquired lines of k-space to their "original" phase-offset values, which includes only the inter-slice phase ramps. Doing so results in the generation of modified or phase-corrected k-space lines of data, as discussed herein with respect to FIG. 2.

Flow 400 may further include one or more processors (e.g., the system computer 20 and/or the image computer 17) generating (block 410) reconstructed clinical images of the object using the phase-corrected (block 408) lines of raw data in k-space, as discussed herein with respect to FIG. 2.

Although the present disclosure has been illustrated and described in detail with the preferred exemplary embodiments, the disclosure is not restricted by the examples given, and other variations can be derived therefrom by a person skilled in the art without departing from the protective scope of the disclosure. Although modifications and changes may be suggested by those skilled in the art, it is the intention to embody all changes and modifications as reasonably and properly come within the scope of their contribution to the art.

It is also pointed out for the sake of completeness that the use of the indefinite articles "a" or "an" does not exclude the possibility that the features in question may also be present more than once. Similarly, the term "unit" does not rule out the possibility that the same consists of a plurality of components which, where necessary, may also be distributed in space.

The claims described herein and the following description in each case contain additional advantages and developments of the embodiments as described herein. In various embodiments, the claims of one claims category can, at the same time, be developed analogously to the claims of a different claims category and the parts of the description pertaining thereto. Furthermore, the various features of different exemplary embodiments and claims may also be combined to create new exemplary embodiments without departing from the spirit and scope of the disclosure.

What is claimed is:

1. A method for acquiring clinical images of an object that is moving during at least a portion of a magnetic resonance imaging (MRI) scan, comprising:
   performing blipped parallel imaging by acquiring, via one or more processors, magnetic resonance (MR) signals of the object using a transmitted imaging pulse sequence that includes one or more gradient sequence pulses and one or more gradient blip pulses;
   recording, via one or more processors, the MR signals in a memory as a set of recorded lines of raw data in k-space, the k-space lines having a phase offset between sequentially-acquired k-space lines as a result of motion of the object while the MR signals are acquired;
   subtracting, via one or more processors, the phase offset from the k-space lines that was introduced as a result of motion of the object to generate multiple phase-corrected k-space lines; and
   generating, via one or more processors using the multiple phase-corrected k-space lines, one or more reconstructed clinical images of the object.

2. The method of claim 1, wherein performing the blipped parallel imaging includes performing one of blipped simultaneous multi-slice (SMS) imaging or blipped Controlled Aliasing in Parallel Imaging (CAIPI) imaging.

3. The method of claim 1, wherein performing the blipped parallel imaging includes performing a three-dimensional (3D) blipped simultaneous multi-slice (SMS) imaging.

4. The method of claim 1, wherein the phase offset is subtracted from the k-space lines during the generation of the one or more reconstructed clinical images of the object and after the lines of raw data are recorded in k-space.

5. The method of claim 4, further comprising:
   receiving, prior to the generation of the one or more reconstructed clinical images of the object, motion data indicative of a motion state of the object during acquisition of the MR signals, the motion data identifying a movement trajectory for each of the k-space lines, wherein the phase offset is subtracted from each of the k-space lines using the motion data.

6. A method for acquiring clinical images of an object that is moving during at least a portion of a magnetic resonance imaging (MRI) scan, comprising:

receiving, via the one or more processors, motion data indicative of a motion state of the object;

modifying, via one or more processors, one or more MR signal acquisition parameters using the motion data;

performing blipped parallel imaging by acquiring, via one or more processors, magnetic resonance (MR) signals of the object using a transmitted imaging pulse sequence that includes one or more gradient sequence pulses and one or more gradient blip pulses;

recording, via one or more processors in accordance with the modified one or more MR signal acquisition parameters, the MR signals in a memory as a set of recorded lines of raw data in k-space, wherein the k-space lines are recorded, via application of the modified one or more MR signal acquisition parameters, as having a phase offset between sequentially-acquired k-space lines that compensates for an additional phase offset that was introduced as a result of motion of the object while the MR signals are acquired; and generating, via one or more processors using the raw data in k-space, one or more reconstructed clinical images of the object.

7. The method of claim 6, wherein performing the blipped parallel imaging includes one of performing blipped simultaneous multi-slice (SMS) imaging or performing blipped Controlled Aliasing in Parallel Imaging (CAIPI) imaging.

8. The method of claim 6, wherein performing the blipped parallel imaging includes performing a three-dimensional (3D) blipped simultaneous multi-slice (SMS) imaging.

9. The method of claim 6, wherein the modified one or more MR signal acquisition parameters include modifying a phase used for acquiring the MR signals.

10. The method of claim 6, wherein receiving the motion data includes receiving the motion data via a camera system that records motion of the object during acquisition of the MR signals.

11. A non-transitory computer readable medium having instructions stored thereon that, when executed by one or more processors of a magnetic resonance apparatus, cause the magnetic resonance apparatus to acquire clinical images of an object that is moving during at least a portion of a magnetic resonance imaging (MRI) scan by:

performing blipped parallel imaging by acquiring, via one or more processors, magnetic resonance (MR) signals of the object using a transmitted imaging pulse sequence that includes one or more gradient sequence pulses and one or more gradient blip pulses;

recording, via one or more processors, the MR signals in a memory as a set of recorded lines of raw data in k-space, the k-space lines having a phase offset between sequentially-acquired k-space lines as a result of motion of the object while the MR signals are acquired;

subtracting, via one or more processors, the phase offset from the k-space lines that was introduced as a result of motion of the object to generate multiple phase-corrected k-space lines; and generating, via one or more processors using the multiple phase-corrected k-space lines, one or more reconstructed clinical images of the object.

12. The non-transitory computer readable medium of claim 11, wherein the instructions, when executed by one or more processors of the magnetic resonance apparatus, cause the magnetic resonance apparatus to perform the parallel imaging in accordance with one of a simultaneous multi-slice (SMS) imaging technique or a blipped Controlled Aliasing in Parallel Imaging (CAIPI) imaging technique.

13. The non-transitory computer readable medium of claim 11, wherein the instructions, when executed by one or more processors of the magnetic resonance apparatus, cause the magnetic resonance apparatus to perform the parallel imaging in accordance with a three-dimensional (3D) blipped simultaneous multi-slice (SMS) imaging technique.

14. The non-transitory computer readable medium of claim 11, wherein the instructions, when executed by one or more processors of the magnetic resonance apparatus, cause the magnetic resonance apparatus to subtract the phase offset from the k-space lines during the generation of the one or more reconstructed clinical images of the object and after the lines of raw data are recorded in k-space.

15. The non-transitory computer readable medium of claim 14, wherein the instructions, when executed by one or more processors of the magnetic resonance apparatus, cause the magnetic resonance apparatus to:

receive, prior to the generation of the one or more reconstructed clinical images of the object, motion data indicative of a motion state of the object during acquisition of the MR signals, the motion data identifying a movement trajectory for each of the k-space lines; and subtract the second phase offset from the k-space lines of each of the k-space lines using the motion data.

16. A non-transitory computer readable medium having instructions stored thereon that, when executed by one or more processors of a magnetic resonance apparatus, cause the magnetic resonance apparatus to acquire clinical images of an object that is moving during at least a portion of a magnetic resonance imaging (MRI) scan by:

receiving, via the one or more processors, motion data indicative of a motion state of the object;

modifying, via one or more processors, one or more MR signal acquisition parameters using the motion data;

performing blipped parallel imaging by acquiring, via one or more processors, magnetic resonance (MR) signals of the object using a transmitted imaging pulse sequence that includes one or more gradient sequence pulses and one or more gradient blip pulses;

recording, via one or more processors in accordance with the modified one or more MR signal acquisition parameters, the MR signals in a memory as a set of recorded lines of raw data in k-space, wherein the k-space lines are recorded, via application of the modified one or more MR signal acquisition parameters, as having a phase offset between sequentially-acquired k-space lines that compensates for an additional phase offset that was introduced as a result of motion of the object while the MR signals are acquired; and generating, via one or more processors using the raw data in k-space, one or more reconstructed clinical images of the object.

17. The non-transitory computer readable medium of claim 16, wherein the instructions, when executed by one or more processors of the magnetic resonance apparatus, cause the magnetic resonance apparatus to perform one of blipped simultaneous multi-slice (SMS) imaging or blipped Controlled Aliasing in Parallel Imaging (CAIPI) imaging.

18. The non-transitory computer readable medium of claim 16, wherein the instructions, when executed by one or more processors of the magnetic resonance apparatus, cause the magnetic resonance apparatus to perform three-dimensional (3D) blipped simultaneous multi-slice (SMS) imaging.

19. The non-transitory computer readable medium of claim 16, wherein the instructions, when executed by one or more processors of the magnetic resonance apparatus, cause the magnetic resonance apparatus to modify the one or more MR signal acquisition parameters by modifying a sampling phase used for acquiring the MR signals.

20. The non-transitory computer readable medium of claim 16, wherein the instructions, when executed by one or more processors of the magnetic resonance apparatus, cause the magnetic resonance apparatus to receive the motion data via a camera system that records motion of the object during acquisition of the MR signals.

* * * * *